United States Patent
Tooher et al.

(10) Patent No.: US 6,380,592 B2
(45) Date of Patent: *Apr. 30, 2002

(54) LOW POWER RAM MEMORY CELL USING A PRECHARGE LINE PULSE DURING WRITE OPERATION

(75) Inventors: Michael Tooher, Stuttgart (DE); Stefano Tonello, Breganze (IT)

(73) Assignee: STMicroelectronics S.r.l., Agrate Brianza (IT)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/200,079

(22) Filed: Nov. 25, 1998

(30) Foreign Application Priority Data

Nov. 28, 1997 (EP) ............................. 97120943

(51) Int. Cl.[7] .................. H01L 29/76; H01L 29/94; H01L 31/062; H01L 31/113; G11C 7/00
(52) U.S. Cl. .................. 257/369; 257/903; 365/203
(58) Field of Search ................. 257/369, 903; 365/203

(56) References Cited

U.S. PATENT DOCUMENTS

| | | | |
|---|---|---|---|
| 3,971,004 A | | 7/1976 | Dingwall |
| 4,541,076 A | * | 9/1985 | Bowers et al. ............... 365/190 |
| 4,712,194 A | * | 12/1987 | Yamaguchi et al. ......... 365/203 |
| 5,097,448 A | * | 3/1992 | Segawa ....................... 365/200 |
| 5,132,929 A | | 7/1992 | Ochii |
| 5,289,432 A | | 2/1994 | Dhong et al. |
| 5,301,147 A | | 4/1994 | Guo et al. |
| 5,365,475 A | * | 11/1994 | Matsummura et al. ...... 365/154 |
| 5,621,693 A | | 4/1997 | Nakase |

FOREIGN PATENT DOCUMENTS

| | | |
|---|---|---|
| DE | 4128919 | 3/1992 |
| EP | 0 359 204 | 3/1990 |
| GB | 2107541 | 4/1983 |

OTHER PUBLICATIONS

European Patent Abstract of Japanese Publication No. 60038796, published on Feb. 28, 1985.
European Patent Abstract of Japanese Publication No. 61024092, published on Feb. 1, 1986.
European Search Report dated May 13, 1998 with annex on European Application No. 97 120943.

* cited by examiner

*Primary Examiner*—Olik Chaudhuri
*Assistant Examiner*—Howard Weiss
(74) *Attorney, Agent, or Firm*—Lisa K. Jorgenson; Stephen Bongini; Fleit, Kain, Gibbons, Gutman & Bongini P.L.

(57) ABSTRACT

A semiconductor memory cell that includes a word line, two bit lines, a precharge line, and two cross-coupled inverters. Each of the inverters is formed by a P-channel transistor and an N-channel transistor. Additionally, a first access transistor selectively couples one bit line to the output of one inverter, and a second access transistor selectively couples the other bit line to the output of the other inverter. One terminal of the N-channel transistor of each of the inverters is connected to the precharge line. In a preferred embodiment, the access transistors are P-channel transistors and the gate terminal of each PMOS access transistor is connected to the word line. Additionally, the present invention provides a method of writing data to a semiconductor memory cell that is connected to a pair of bit lines.

30 Claims, 5 Drawing Sheets

LOW POWER RAM MEMORY CELL USING A PRECHARGE LINE PULSE DURING WRITE OPERATION

CROSS-REFERENCE TO RELATED APPLICATIONS

This application is based upon and claims priority from prior European Patent Application No. 97-120943.2, filed Nov. 28, 1997, the entire disclosure of which is herein incorporated by reference.

BACKGROUND OF THE INVENTION

1. Field of the Invention

The present invention relates to a semiconductor memory device, and more specifically to a low power RAM memory cell having cross-coupled CMOS inverters.

2. Description of the Related Art

A conventional semiconductor static random access memory (SRAM) device is formed with static memory cells that each have six transistors. FIG. 1 shows a conventional CMOS six transistor SRAM memory cell. The memory cell 1 includes a pair of cross-coupled CMOS inverters 2 and 3, each of which is coupled to a bit line 4 and 5. In particular, the first inverter 2 is coupled to a first bit line 4 through a bi-directional access device 6, and the second inverter 3 is coupled to an adjacent second bit line 5 through a second access device 7. During reading and writing operations, different voltages must be applied to the two bit lines 4 and 5. Thus, this type of access to the storage node of the memory cell can be termed "differential."

More specifically, during reading from the memory cell of FIG. 1, the bit line voltage swing amplitude is dependent upon the length of time the memory cell has been activated. The voltage difference caused by the swing can be kept quite small and sensed by the sense amplifier of the memory device in order to reduce power consumption. Further, during writing to the memory cell, the bit line voltage swing is made as large as possible (e.g., the full CMOS logic voltage level) in order to toggle (i.e., write to) the memory cell. Thus, in an SRAM six transistor memory cell array with m rows and n columns, the current consumption during reading and writing can be estimated using the following formulas:

$$Idd_r = n*m*Cb*\Delta V/dt \quad (1)$$

$$Idd_w = n*m*Cb*\Delta V_w/dt \quad (2)$$

where n is the number of bits in the word being read or written, Cb is the bit line capacitance associated with a given cell, $\Delta V_r$ is the bit line voltage swing during a read operation, and $\Delta V_w$ is the bit line voltage swing during a write operation. Typically, $\Delta V_w$ corresponds to the supply voltage level Vdd.

Previous efforts to reduce the power consumed by such a memory matrix focus on changing one or more of the parameters in the above formulas. One such technique is disclosed by N. Kushiyama et al. in "A 295 MHz CMOS 1M (×256) embedded SRAM using I-directional read/write shared sense amplifiers and self-timed pulsed word-line drivers" (ISSCC Dig. Tech. Papers, February 1995, pages 182–183). According to this technique, power consumption is reduced by reducing the number of cells on the bit line through a hierarchical bit line scheme.

Another power reduction technique is disclosed by B. Amrutur and H. Horowitz in "Technique to reduce power in fast wide memories" (Dig. Tech. Papers, October 1994, Symp. on Low Power Electronics, pages 92–93). This technique reduces power consumption by limiting the bit line voltage swing during a read by controlling the word line pulse length. Yet another power reduction technique is disclosed by T. Blalock and R. Jager in "A high-speed clamped bit line current-mode sense amplifier" (IEEE J. Solid State Circuits, Vol. 26, No. 4, April 1991, pages 542–548). This solution also reduces power consumption by limiting the bit line voltage swing during a read, but does so using current-mode sense amplifiers so as to reduce $\Delta V_r$. Still another power reduction technique limits the bit line voltage swing during a write to a predetermined value (i.e., Vdd–Vt) using NMOS transistors during precharging.

SUMMARY OF THE INVENTION

In view of these drawbacks, it is an object of the present invention to remove the above-mentioned drawbacks and to provide a RAM memory device with reduced power consumption. A RAM memory device is formed with memory cells that each have cross-coupled inverters, and the pull-down transistors of the inverters are connected to a precharge line. During operation, the source terminals of the pull-down transistors in the memory cell are precharged to "reset" the internal nodes of the memory cell to a predetermined state. Then, data can be stored by creating a small voltage difference between bit lines and coupling the bit lines to the internal nodes of the memory cell. In an alternative embodiment of the present invention, the pull-up transistors of the inverters are connected to a precharge line so that the source terminals of the pull-up transistors in the memory cell are precharged.

Another object of the present invention is to provide a RAM memory device that has relatively long word length but reduced power consumption.

A further object of the present invention is to provide a technique for reducing voltage swing on the memory array bit lines during a write operation.

Yet another object of the present invention is to provide a RAM memory device having a simple write operation.

One embodiment of the present invention provides a semiconductor memory cell that includes a word line, two bit lines, a precharge line, and two cross-coupled inverters. Each inverter is formed by a P-channel transistor and an N-channel transistor. Additionally, a first access transistor selectively couples one bit line to the output of one inverter, and a second access transistor selectively couples the other bit line to the output of the other inverter. One terminal of the N-channel transistor of each of the inverters is connected to the precharge line. In a preferred embodiment, the access transistors are P-channel transistors and the gate terminal of each PMOS access transistor is connected to the word line. Additionally, the present invention provides a method of writing data to a semiconductor memory cell that is connected to a pair of bit lines.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
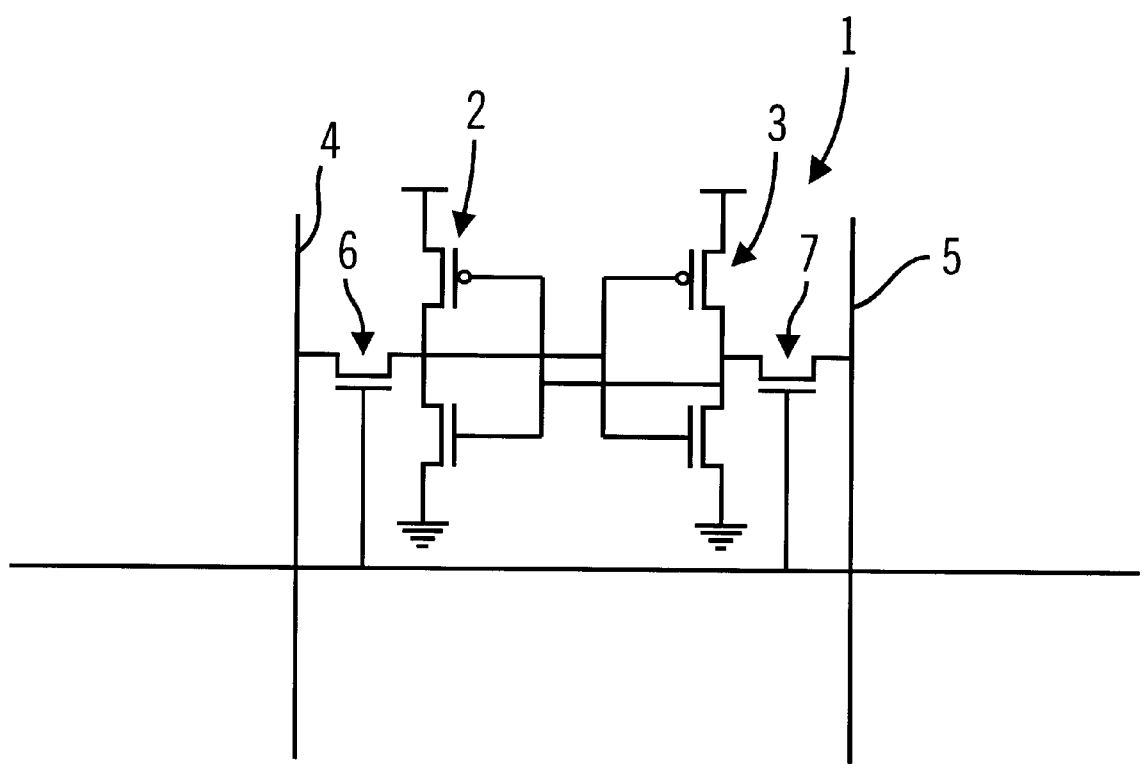
FIG. 1 is a schematic diagram of a conventional CMOS SRAM memory cell.
Figure 2:
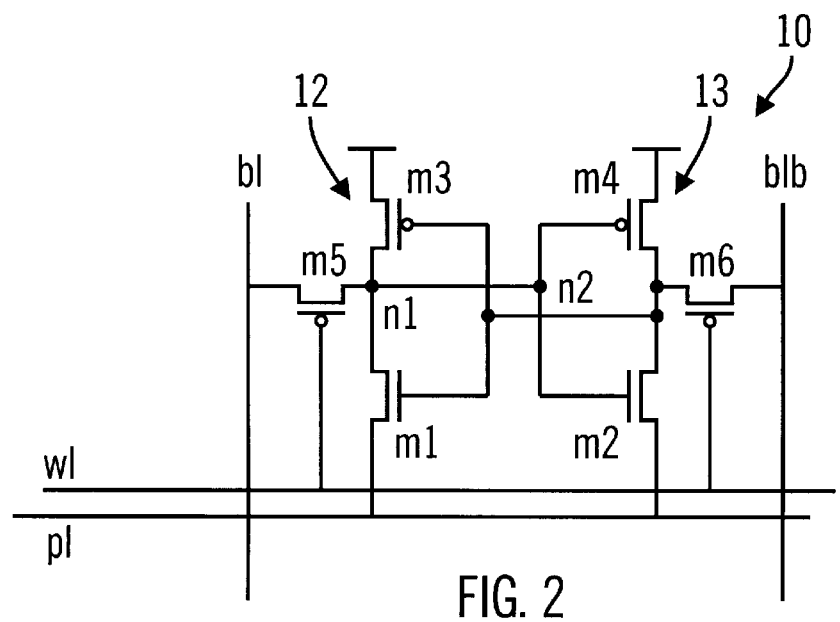
FIG. 2 is a schematic diagram of a memory cell according to a first embodiment of the present invention.

FIG. 2 shows a static random access memory (SRAM) cell according to a preferred embodiment of the present invention. The memory cell 10, which is formed using CMOS technology, is designed for a semiconductor SRAM memory device of the type having six transistor memory cells. In particular, the memory cell 10 of FIG. 2 is integrated into a memory array or matrix that includes m rows and n columns, as partially shown in FIG. 3. Rows are identified with word lines WL and columns are identified with bit lines BL of the memory device. One of the memory cells 10 is located at each intersection of a word line WL and a pair of adjacent bit lines BL and BLB.

As shown in FIG. 2, the memory cell 10 includes two CMOS inverters 12 and 13 that each have a pull-up PMOS transistor and a pull-down NMOS transistor. The two inverters 12 and 13 are cross-coupled (i.e., for each inverter, the interconnection node for the two transistors of the inverter is connected to the gate terminals of the two transistors of the other inverter). More specifically, the first inverter 12 has a PMOS transistor M3 and an NMOS transistor M1 connected in series, and the second inverter 13 has a PMOS transistor M4 and an NMOS transistor M2 connected in series. The gate terminals of the transistors M1 and M3 of the first inverter 12 are connected to a first node N1, which is the series connection point of the drain terminals of the second inverter 13. Likewise, the gate terminals of the transistors M2 and M4 of the second inverter 13 are connected to a second node N2, which is the series connection point of the drain terminals of the first inverter 12.

Figure 3:
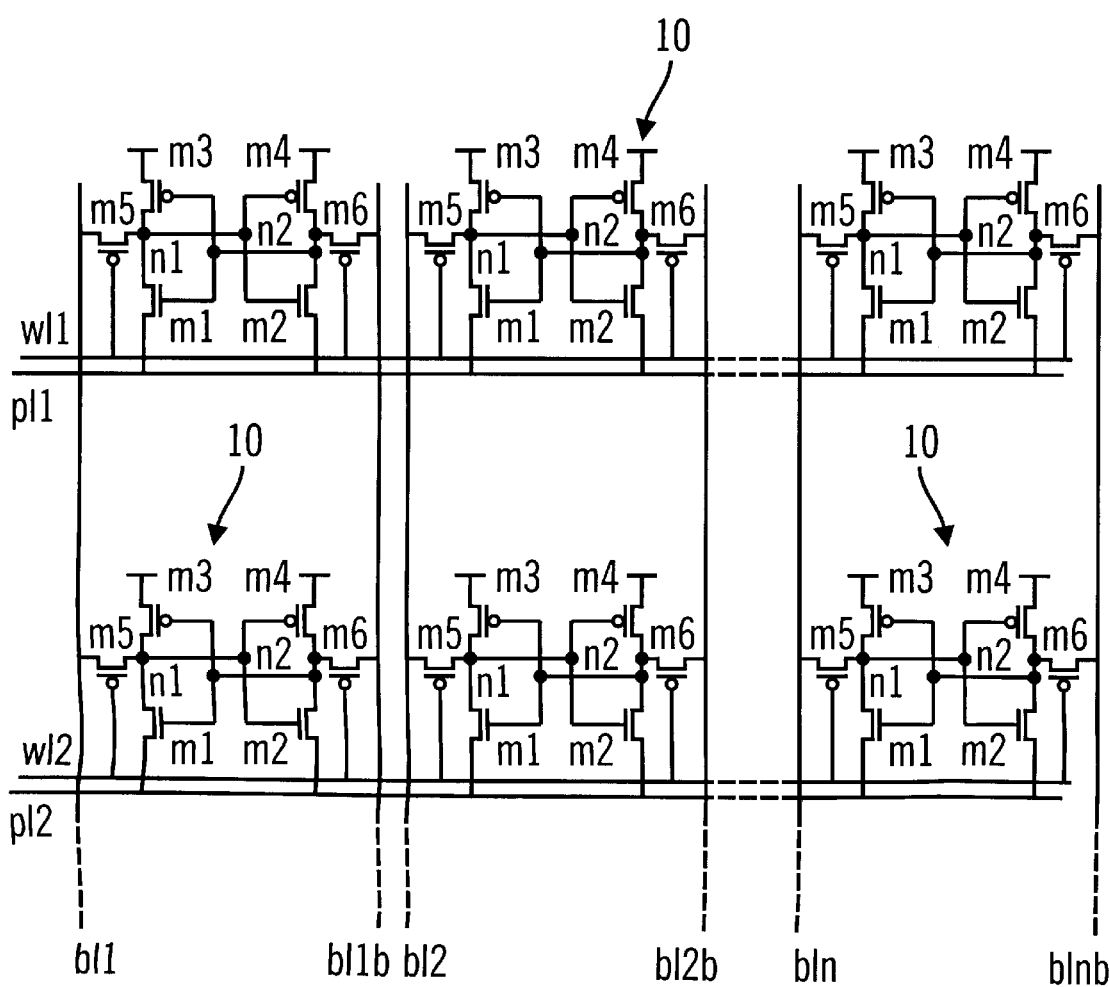
FIG. 3 is a schematic diagram of a portion of a memory array that includes the memory cells of FIG. 2.

The second node N2 is coupled to a first bit line BL through a first access transistor (e.g., PMOS transistor) M5, the first node N1 is coupled to a second bit line BLB through a second access transistor (e.g., PMOS transistor) M6, and the gate terminals of the access transistors M5 and M6 are connected to the word line WL. The source terminals of the two PMOS transistors M3 and M4 are connected to a voltage supply line Vdd. Further, the source terminals of the two NMOS transistor M1 and M2 of the first and second inverters are connected to a precharge line PL. The precharge line PL is an added line that is common to all the memory cells 10 in a row (i.e., all those connected to one of the word lines). FIG. 3 shows a portion of the structure of a memory matrix that includes such memory cells 10.

During operation of the SRAM memory device of FIG. 3, when a memory cell is not accessed or read from, the corresponding precharge line PL is coupled to ground. This provides the ground potential to the source terminals of the NMOS transistors M1 and M2 so that both data retention and read operations are performed in the same manner as in a conventional SRAM memory cell. Further, the PMOS access transistors M5 and M6 do not affect the transfer of data from the memory cell to the bit lines. On the other hand, a memory cell is written to using the following process.

First, a pulse is supplied to the corresponding precharge line PL so as to "reset" the first and second nodes N1 and N2 of each memory cell connected to the precharge line to the high (1) logic level. More specifically, the node N1 or N2 that had been at a low (0) logic level is raised to the voltage level Vdd–Vtn by the corresponding NMOS transistor M1 or M2. Next, the data to be written to the memory cell is placed on the corresponding bit lines BL and BLB as a small voltage difference (i.e., the levels of the bit lines are set according to the memory word to be written). The smaller the voltage difference, the less power is consumed.

Then, the word line WL is activated so as to supply a negative pulse to the gate terminals of the PMOS access transistors M5 and M6. Because the pulse on the precharge line PL eliminates the current path to ground, the bit lines BL and BLB can easily pass the small voltage difference to the internal nodes N1 and N2. That is, the PMOS access transistors M5 and M6 allow a small voltage difference having a value centered around the supply voltage Vdd to be transferred to the internal nodes. In contrast, conventional memory cells using NMOS access transistors require the voltage difference between the bit lines to be larger than the threshold voltage of an NMOS transistor.

Next, the pulse to the precharge line PL is ended and the memory cell 10 acts as a latch-type sense amplifier. More specifically, as the potential on the precharge line PL moves back towards ground, the symmetric internal nodes N1 and N2 become unstable and latch in the direction of the small voltage difference that was received from the bit lines. Finally, the word line WL is deactivated to uncouple the internal nodes N1 and N2 of the memory cell from the bit lines and end the write operation.

Figure 4:
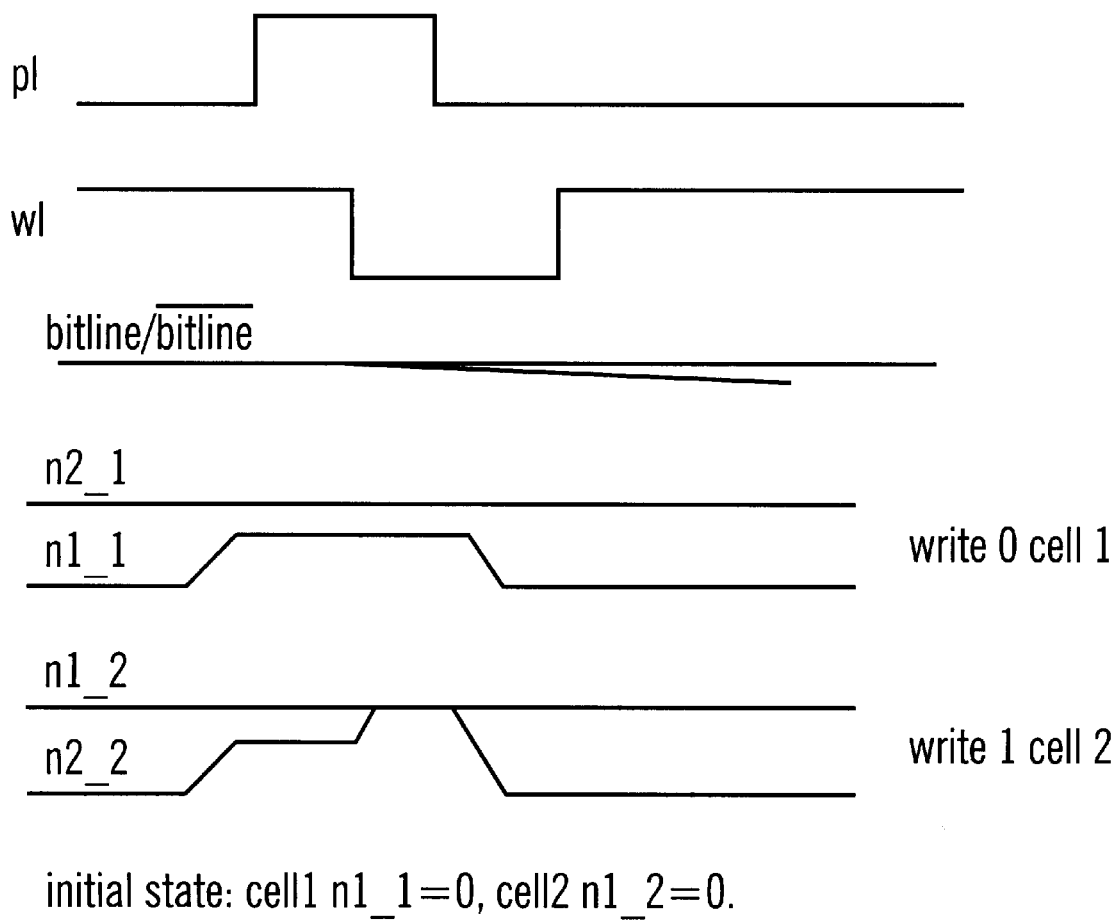
FIG. 4 is a timing diagram for a write operation in the memory cell of FIG. 2.

FIG. 4 is a timing diagram for such a write operation in the SRAM memory device of FIG. 3. The illustrated write operation relates to the writing of two memory cells of a memory word.

Figure 5:
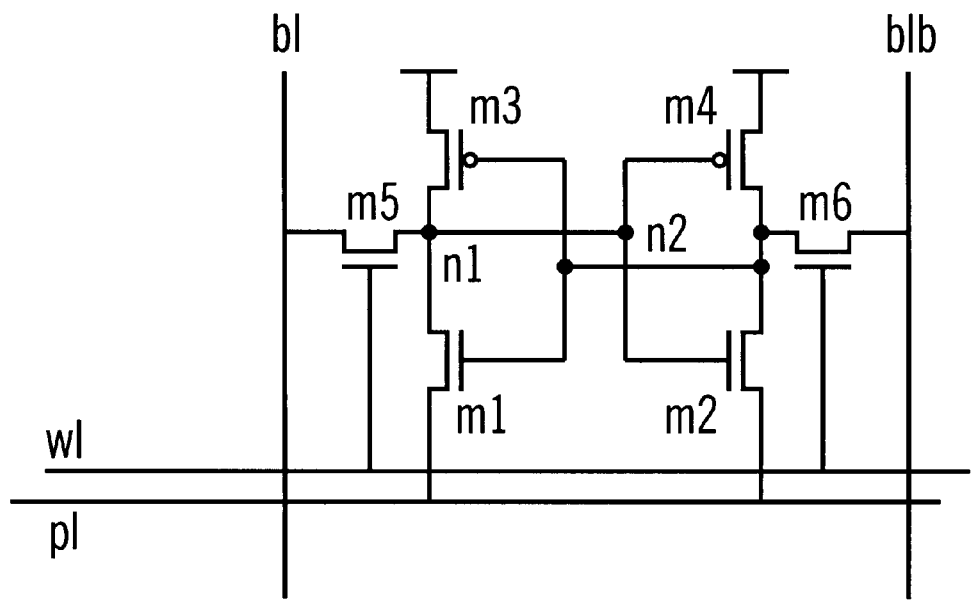
FIG. 5 is a schematic diagram of a memory cell according to a second embodiment of the present invention.

A memory cell according to a second embodiment of the present invention is shown in FIG. 5. In this embodiment, NMOS transistors are used as the access transistors M5 and M6. As a result, in the second embodiment the bit lines are precharged low between operations, and the internal nodes N1 and N2 are precharged high before a write operation.

Figure 6:
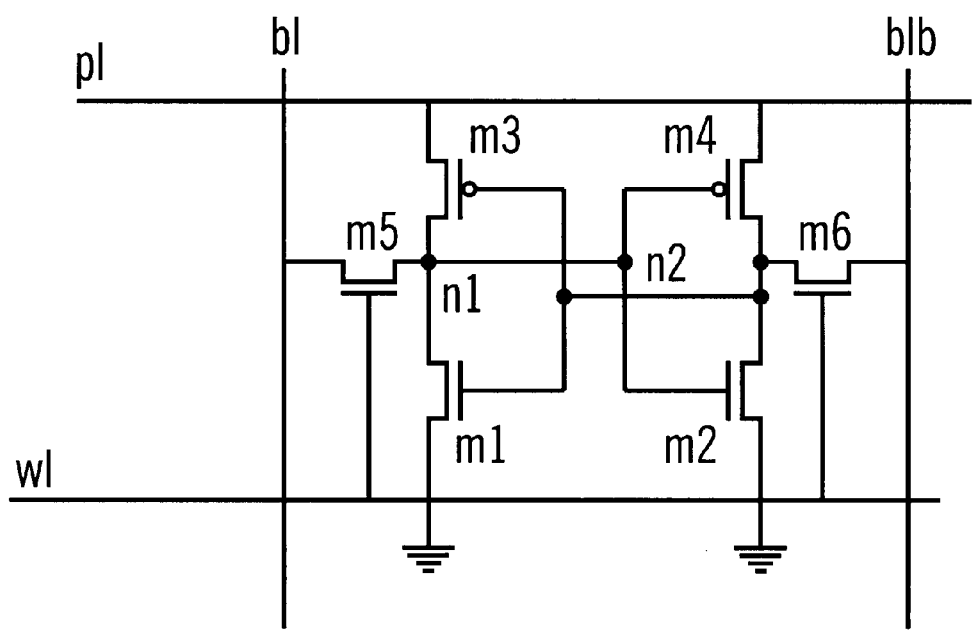
FIG. 6 is a schematic diagram of a memory cell according to a third embodiment of the present invention.

FIG. 6 shows a memory cell according to a third embodiment of the present invention. In the third embodiment, the source terminals of the pull-up transistors M3 and M4 are connected to a precharge line PL that runs parallel to the word line. Additionally, the source terminals of the pull-down transistors M1 and M2 are connected to ground, and NMOS transistors are used as the access transistors M5 and M6. As a result, in the third embodiment the bit lines are precharged low between operations, and the internal nodes N1 and N2 are precharged low before a write operation.

Figure 7:
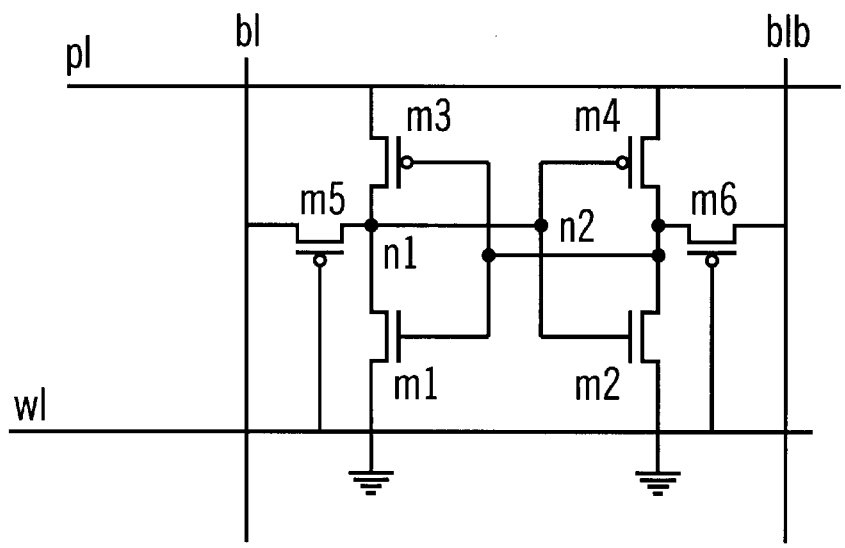
FIG. 7 is a schematic diagram of a memory cell according to a fourth embodiment of the present invention.

FIG. 7 shows a memory cell according to a fourth embodiment of the present invention. The fourth embodiment substantially corresponds to the memory cell of the third embodiment (FIG. 6), except that PMOS transistors are used as the access transistors M5 and M6. In particular, the source terminals of the pull-up transistors M3 and M4 are connected to a precharge line PL, a PMOS access transistor M5 is connected between node N2 and one bit line, and another PMOS access transistor M6 is connected between node N1 and the other bit line. The gate terminals of the access transistors M5 and M6 are connected to the word line WL. As a result, in the fourth embodiment the bit lines are precharged high between operations, and the internal nodes N1 and N2 are precharged low before a write operation.

Figure 8:
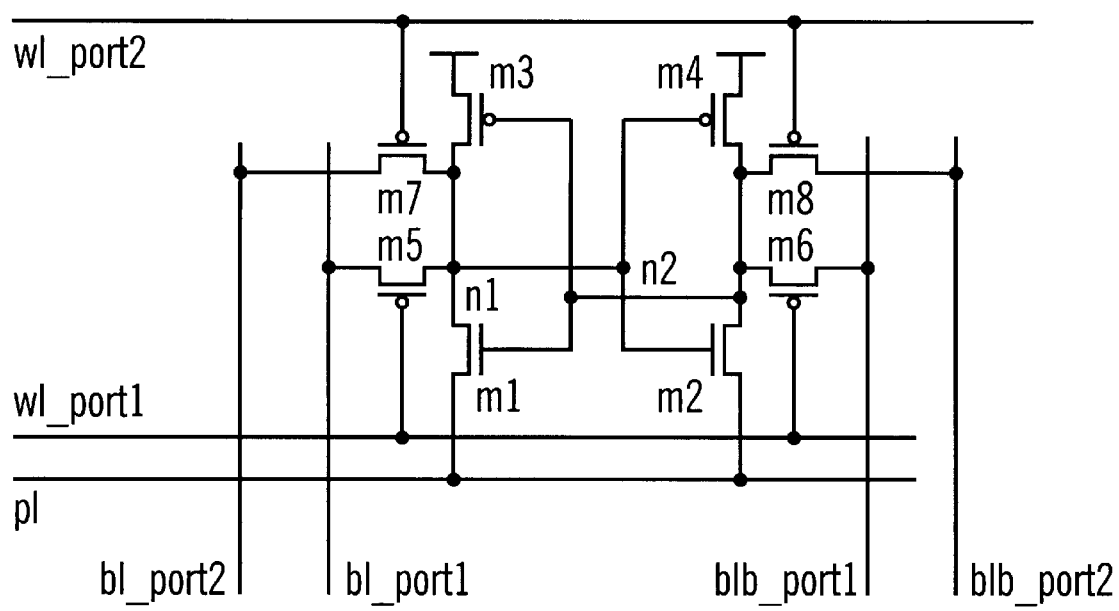
FIG. 8 is a schematic diagram of a dual port memory cell according to a fifth embodiment of the present invention.

A dual port memory cell according to a fifth embodiment of the present invention is shown in FIG. 8. The dual port feature provides a memory cell that is connected to a pair of word lines WL_PORT1 and WL_PORT2 and two pairs of bit lines BL_PORT1 and BL_PORT2, and BLB_PORT1, BLB_PORT2. As shown, the first word line WL_PORT1 and the first bit line pair BL_PORT1 and BLB_PORT1 are connected to the memory cell in the same manner as in the first embodiment (FIG. 2). Additionally, a second pair of PMOS access transistors M7 and M8 is provided to selectively couple the cell to the second word line WL_PORT2 and the second bit line pair BL_PORT2 and BLB_PORT2.

More specifically, the second node N2 is connected to the one of the second bit lines BL_PORT1 through the PMOS access transistor M7, and the first node N1 is connected to the other of the second bit lines BLB_PORT2 through the PMOS access transistor M8. The gate terminals of the added PMOS access transistors M7 and M8 are connected to the second word line WL_PORT2. In this dual port embodiment, simultaneous read and write operations from the two ports PORT1 and PORT2 to the same memory cell are prohibited. In further dual port embodiments, NMOS transistors are used as the access transistors (as in the second embodiment) and/or the source terminals of the pull-up transistors are connected to the precharge line PL (as in the third embodiment).

As previously explained, the present invention provides a RAM memory cell having cross-coupled inverters with either the pull-down transistors or the pull-up transistors of the inverters being connected to a precharge line. During a write operation, the precharge line is used to "reset" the internal nodes of the memory cell to a predetermined state. This allows data to be stored by creating a small voltage difference between the bit lines. Thus, the memory cell of the present invention allows power consumption to be reduced without introducing significant complexities into the writing process. The present invention is particularly useful for memory devices with very long word lengths.

While there has been illustrated and described what are presently considered to be the preferred embodiments of the present invention, it will be understood by those skilled in the art that various other modifications may be made, and equivalents may be substituted, without departing from the true scope of the invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. A semiconductor memory comprising:
   a first word line;
   first and second bit lines;
   a precharge line;
   first and second cross-coupled inverters, the first inverter including a first P-channel transistor and a first N-channel transistor, and the second inverter including a second P-channel transistor and a second N-channel transistor one terminal of each of the first and second N-channel transistors being connected to the precharge line;
   first and second access transistors, the first access transistor selectively coupling the first bit line to an input node of the first inverter, and the second access transistor selectively coupling the second bit line to an input node of the second inverter; and
   a control circuit for supplying a voltage pulse to the precharge line during an operation for writing data to the memory so as to precharge the input node of the first inverter and the input node of the second inverter to the same predetermined logic level.

2. The semiconductor memory as defined in claim 1, wherein the first and second access transistors are P-channel transistors.

3. The semiconductor memory as defined in claim 1, wherein the gate terminal of each of the first and second access transistors is connected to the first word line.

4. The semiconductor memory as defined in claim 3, wherein the first and second access transistors are P-channel transistors.

5. The semiconductor memory as defined in claim 1, wherein the precharge line runs parallel to the first word line.

6. The semiconductor memory as defined in claim 1, wherein the memory is a dual port RAM memory.

7. The semiconductor memory as defined in claim 1, wherein the control circuit, during the writing operation, supplies the voltage pulse to the precharge line, supplies data to be written as a small voltage difference between the first and second bit lines, and activates the first word line.

8. The semiconductor memory as defined in claim 7, wherein the control circuit discontinues the pulse on the precharge line after activating the first word line, and then deactivates the first word line.

9. The semiconductor memory as defined in claim 1, wherein the memory is a static RAM memory.

10. The semiconductor memory as defined in claim 6, further comprising:
    a second word line;
    third and fourth bit lines; and
    third and fourth access transistors, the third access transistor selectively coupling the third bit line to the output of the first inverter, and the fourth access transistor selectively coupling the fourth bit line to the output of the second inverter,
    wherein the gate terminal of each of the third and fourth access transistors is connected to the second word line.

11. A semiconductor memory cell comprising:
    a first word line;
    first and second bit lines;
    first and second cross-coupled inverters, the first inverter including a first P-channel transistor and a first N-channel transistor, and the second inverter including a second P-channel transistor and a second N-channel transistor;
    first and second access transistors controlled by the word line, the first access transistor selectively coupling the first bit line to an input node of the first inverter, and the second access transistor selectively coupling the second bit line to an input node of the second inverter; and
    means for resetting the input nodes of the first and second inverters to the same logic level during an operation for writing data to the memory cell in order to break the feedback loop of the memory cell, the means for resetting being coupled to one terminal of one of the transistors of the first inverter and one terminal of one of the transistors of the second inverter.

12. A semiconductor memory comprising:
   a first word line;
   first and second bit lines;
   a precharge line;
   first and second cross-coupled inverters, the first inverter including a first P-channel transistor and a first N-channel transistor, and the second inverter including a second P-channel transistor and a second N-channel transistor one terminal of each of the first and second P-channel transistors being connected to the precharge line;
   first and second access transistors, the first access transistor selectively coupling the first bit line to an input node of the first inverter, and the second access transistor selectively coupling the second bit line to an input node of the second inverter; and
   a control circuit for supplying a voltage pulse to the precharge line during an operation for writing data to the memory so as to precharge the input node of the first inverter and the input node of the second inverter to the same predetermined logic level.

13. The semiconductor memory as defined in claim 12, wherein the first and second access transistors are P-channel transistors.

14. The semiconductor memory as defined in claim 12, wherein the gate terminal of each of the first and second access transistors is connected to the first word line.

15. The semiconductor memory as defined in claim 14, wherein the first and second access transistors are P-channel transistors.

16. The semiconductor memory as defined in claim 12, wherein the precharge line runs parallel to the first word line.

17. The semiconductor memory as defined in claim 12, wherein the memory is a static RAM memory.

18. The semiconductor memory as defined in claim 12, wherein the control circuit, during the writing operation, supplies the voltage pulse to the precharge line, supplies data to be written as a small voltage difference between the first and second bit lines, and activates the first word line.

19. The semiconductor memory as defined in claim 18, wherein the control circuit discontinues the pulse on the precharge line after activating the first word line, and then deactivates the first word line.

20. The semiconductor memory as defined in claim 17, further comprising:
   a second word line;
   third and fourth bit lines; and
   third and fourth access transistors, the third access transistor selectively coupling the third bit line to the output of the first inverter, and the fourth access transistor selectively coupling the fourth bit line to the output of the second inverter,
   wherein the gate terminal of each of the third and fourth access transistors is connected to the second word line.

21. The semiconductor memory as defined in claim 1, wherein the control circuit supplies a positive voltage pulse to the precharge line during the writing operation so as to precharge the input nodes of both the first and second inverters to a high logic level.

22. A semiconductor memory device comprising:
   a plurality of word lines;
   a plurality of a bit line pairs;
   a plurality of precharge lines;
   a plurality of memory cells, each memory cell including:
      first and second cross-coupled inverters, the first inverter including a first P-channel transistor and a first N-channel transistor, and the second inverter including a second P-channel transistor and a second N-channel transistor, one terminal of one of the transistors of the first inverter and one terminal of one of the transistors of the second inverter being connected to one of the precharge lines; and
      first and second access transistors the first access transistor selectively coupling the one bit line of a bit line pair to an input node of the first inverter, and the second access transistor selectively coupling another bit line of the bit line pair to an input node of the second inverter; and
   a control circuit for supplying a voltage pulse to at least one of the precharge lines during an operation for writing data to the memory cell so as to precharge the input nodes of the first and second inverters of at least one of the memory cells to the same predetermined logic level.

23. The semiconductor memory device as defined in claim 22, wherein each of the access transistors is a P-channel transistor.

24. The semiconductor memory device as defined in claim 22,
   wherein the gate terminal of each of the access transistors is connected to one of the word lines, and
   each precharge line runs parallel to one of the word lines.

25. The semiconductor memory device as defined in claim 24, wherein each of the precharge lines is commonly connected to all the memory cells of a corresponding word line.

26. The semiconductor memory device as defined in claim 22, wherein the control circuit, during the writing operation, supplies the voltage pulse to the at least one precharge line, supplies data to be written as a small voltage difference between at least one bit line pair, and activates one of the word lines.

27. The semiconductor memory device as defined in claim 26, wherein the control circuit discontinues the pulse on the one precharge line after activating the one word line, and then deactivates the one word line.

28. A method of writing data to a semiconductor memory cell that is connected to a pair of bit lines, the memory cell including first and second cross-coupled inverters, a precharge line being connected to one of the transistors of the first inverter and one of the transistors of the second inverter, said method comprising the steps of:
   supplying a voltage pulse to the precharge line during an operation for writing data to the memory cell in order to precharge input nodes of both the first and second inverters of the memory cell to the same predetermined logic level;
   supplying data to be written to the memory cell as a small voltage difference between the pair of bit lines; and
   activating a word line in order to transfer the voltage difference on the pair of bit lines to the memory cell.

29. The method as defined in claim 28, further comprising the step of discontinuing the pulse signal on the precharge line and then deactivating the word line so as to allow the memory cell to latch the data.

30. The semiconductor memory as defined in claim 12, wherein the control circuit supplies a negative voltage pulse to the precharge line during the writing operation so as to precharge the input nodes of both the first and second inverters to a low logic level.

* * * * *